US012784859B1

(12) United States Patent
Maxted

(10) Patent No.: US 12,784,859 B1
(45) Date of Patent: Nov. 3, 2026

(54) DYNAMIC ROW ADDRESS MAPPING FOR MITIGATING ROW HAMMER EFFECT IN DRAM

(71) Applicant: James Maxted, Cedar Rapids, IA (US)

(72) Inventor: James Maxted, Cedar Rapids, IA (US)

( * ) Notice: Subject to any disclaimer, the term of this patent is extended or adjusted under 35 U.S.C. 154(b) by 0 days.

(21) Appl. No.: 19/382,665

(22) Filed: Nov. 7, 2025

Related U.S. Application Data

(60) Provisional application No. 63/883,992, filed on Sep. 18, 2025.

(51) Int. Cl.
*G11C 29/18* (2006.01)
*G11C 11/406* (2006.01)
*G11C 11/408* (2006.01)

(52) U.S. Cl.
CPC ........ *G11C 29/18* (2013.01); *G11C 11/40615* (2013.01); *G11C 11/4087* (2013.01); *G11C 2029/1806* (2013.01)

(58) Field of Classification Search
CPC . G06F 12/0215; G06F 12/0284; G11C 29/18; G11C 2029/1806; G11C 11/4087; G11C 11/40611; G11C 11/4078; G11C 11/408; G11C 29/00
See application file for complete search history.

(56) References Cited

U.S. PATENT DOCUMENTS 9,236,110 B2 * 1/2016 Bains .................... G06F 3/0619
9,299,400 B2 * 3/2016 Bains ................ G11C 11/40611
9,812,185 B2 * 11/2017 Fisch .................. G11C 11/4087
9,934,143 B2 * 4/2018 Bains ................. G06F 12/0638
10,108,365 B1 10/2018 Bittlestone
10,528,736 B1 1/2020 Sobel et al.
10,790,005 B1 * 9/2020 He .................... G11C 11/40615
10,950,292 B1 3/2021 Seyedmohammad et al.
11,037,618 B2 6/2021 Eojin et al.
11,354,408 B2 6/2022 Ghosh et al.
11,488,654 B2 11/2022 Seyedzadehdelcheh
11,527,280 B2 12/2022 Bennett et al.
11,640,840 B2 5/2023 Seyedmohammad et al.
11,887,686 B2 1/2024 Jin et al.
12,002,502 B2 6/2024 Hong
12,026,387 B2 7/2024 Seyedzadehdelcheh et al.
12,027,199 B2 7/2024 You et al.
12,032,692 B2 7/2024 Le Rolland et al.
12,067,270 B2 8/2024 Lu
12,094,515 B2 9/2024 Van Der Veen et al.
12,105,971 B2 10/2024 Del Gatto et al.
12,131,071 B2 10/2024 Majumdar et al.
(Continued)

FOREIGN PATENT DOCUMENTS

CN 119418750 2/2025
CN 121148442 A * 12/2025 ......... G11C 11/4078
(Continued)

*Primary Examiner* — Justin R Knapp
(74) *Attorney, Agent, or Firm* — SHUTTLEWORTH & INGERSOLL, PLC; Jason R. Sytsma

(57) ABSTRACT

A dynamic mapping row decoder that is configured for storing a virtual row address for each of the plurality of rows and a state value for each of the plurality of rows wherein the state value is one of an active state and an inactive state. Control logic is provided to ensure data is never written back to the same row from which the data was immediately previously read.

18 Claims, 17 Drawing Sheets

(56) References Cited

U.S. PATENT DOCUMENTS

| | | | |
|---|---|---|---|
| 12,175,087 | B2 | 12/2024 | Seyedzadehdelcheh et al. |
| 12,189,764 | B2 | 1/2025 | Agarwal et al. |
| 12,211,543 | B2 | 1/2025 | Van Der Veen et al. |
| 12,217,824 | B2 | 2/2025 | Gieske et al. |
| 12,236,996 | B2 | 2/2025 | Lee et al. |
| 12,242,388 | B2 | 3/2025 | Akel et al. |
| 12,254,203 | B2 | 3/2025 | Deutsch et al. |
| 12,308,069 | B2 | 5/2025 | Van Der Veen et al. |
| 12,347,477 | B2 | 7/2025 | Lee et al. |
| 12,354,640 | B2 | 7/2025 | Kim et al. |
| 12,394,466 | B2 | 8/2025 | Kim et al. |
| 12,394,468 | B2 | 8/2025 | Gieske et al. |
| 12,412,614 | B2 | 9/2025 | Confalonieri et al. |
| 12,412,615 | B2 | 9/2025 | Ahn et al. |
| 12,431,182 | B2 | 9/2025 | Vogelsang et al. |
| 12,443,367 | B2 | 10/2025 | Nale et al. |
| 12,456,509 | B2 | 10/2025 | Kim et al. |
| 2017/0117030 | A1 | 4/2017 | Fisch |
| 2020/0042451 | A1 | 2/2020 | Karmakar |
| 2021/0089455 | A1 | 3/2021 | Berger |
| 2022/0188238 | A1 | 6/2022 | Su |
| 2023/0072394 | A1 | 3/2023 | Haywood |
| 2023/0205872 | A1* | 6/2023 | Kotra .................... G06F 21/554 726/23 |
| 2023/0236968 | A1 | 7/2023 | Gieske |
| 2025/0156351 | A1* | 5/2025 | Sancon ................... G06F 13/18 |

FOREIGN PATENT DOCUMENTS

| | | |
|---|---|---|
| JP | 2002334580 A | 11/2002 |
| TW | 202411995 | 3/2024 |

* cited by examiner

DYNAMIC ROW ADDRESS MAPPING FOR MITIGATING ROW HAMMER EFFECT IN DRAM

PRIORITY

This non-provisional application claims priority to U.S. Provisional Patent Application No. 63/883,992 filed on Sep. 18, 2025, the entirety of which is hereby incorporated by reference herein.

TECHNICAL FIELD

This disclosure relates generally to memory devices, and, more specifically, this disclosure is directed towards dynamically mapping row addresses in a dynamic random access memory (DRAM) device to mitigate row hammer effect.

BACKGROUND

All Dynamic RAM (DRAM) memory devices store information in the form of electrical charge stored in a capacitor with one capacitor per bit of storage. The actual information storage array is organized as a 2-dimensional structural array of rows and columns. When a specific location within the memory is accessed, one entire row is read, the information updated, and the row in the storage array is then rewritten.

FIG. 1 shows the functional blocks of a representative synchronous DRAM (SDRAM) 10. DRAM comprises high-density data storage through an array of capacitive cells arranged in rows and columns. Each cell in this architecture stores a single bit of information as a charge in a capacitor C, paired with an access transistor T (see FIG. 2) that enables selective interaction with the stored data. However, the inherent volatility of these capacitors necessitates periodic refresh operations to counteract charge leakage, ensuring data integrity over time. Conventional DRAM systems address this challenge through a coordinated interplay of address handling, decoding, sensing, and timing mechanisms, as described herein.

In a typical DRAM configuration, external row and column addresses are multiplexed and directed to dedicated processing elements. The row address is captured by a row address latch 16, which stabilizes the signal for subsequent decoding, while the column address is fed into a column address counter 18 capable of sequential incrementation to facilitate burst-mode accesses across multiple columns within an activated row. To manage refresh requirements, a dedicated refresh counter 20 autonomously generates row addresses, injecting them into the row address latch 16 during designated cycles to systematically recharge entire rows without interrupting primary data operations.

These latched and counted addresses are then routed to respective decoders for translation into physical selection signals. The row decoder 22, driven by the row address latch 16 (or refresh counter as applicable), activates a specific word line within the cell array, thereby opening the access transistors along that row and coupling the capacitors' stored charges onto complementary bit lines. This row activation phase exposes the contents of the selected row for sensing. Concurrently, the column decoder 24, informed by the column address counter 18, isolates specific bit line pairs from the activated row, directing them toward peripheral circuitry for data extraction or modification.

The selected bit lines interface with read/write circuits and associated latches 26, which serve as the interface between the core cell array 14 and external data paths. During read operations, sense amplifiers within these circuits detect and amplify the differential voltages on the bit lines, latching the resulting digital values for reliable transfer. For write operations, the circuits impose prescribed voltages onto the bit lines to reprogram the target capacitors. The outputs of these read/write circuits 26 connect to data input and output registers 28, which buffer incoming write data from the system bus and stage read data for delivery, thereby accommodating timing mismatches between the DRAM core and the host processor.

Overseeing the timing of these processes is a mode register and timing control circuit 30, synchronized to an external clock signal. The mode register configures operational parameters, such as burst length or power management modes, while the timing control circuit 30 enforces precise sequencing of activation, sensing, and precharge phases across multiple clock cycles. This clock-driven framework ensures orderly progression through the multi-step access cycle to preserve signal integrity.

FIG. 2A shows a single bit 12 of storage within a cell array 14. FIG. 2B shows two adjacent bit lines 12 within cell array 14 to illustrate how the charging and discharging of adjacent capacitors C can influence each other leading to the row hammer effect. The actual data storage mechanism within a DRAM is charge on a capacitor C. When information is written to the cell array 14, an entire row within the array must be written. The bit line for each cell in the row is set to a high or low voltage and the specific row select line is activated. This will then either charge or discharge every capacitor in the row according to the value on its associated bit line.

When data is read from the array, a row select line is activated. The state of every bit cell capacitor C is then sensed, and the resulting detected bit value is captured in a row buffer latch. This action is destructive; any bit capacitor that is charged will be discharged by reading the row values. Once the row data has been latched, the specific location information as determined by the column address is then passed to the DRAM data signals for a READ operation. For a WRITE operation, the input data modifies the selected information within the row buffer. In both cases, the row buffer information is then written back to the cell array 14 by activating the proper row select line.

Once information has been written to the cell array 14, the charge stored on each of the capacitors will dissipate (i.e., leak off) as time progresses. Therefore, each row within the cell array must be read and written to recharge the storage capacitors in the array. This is known as REFRESH and must be done within a specified time to maintain the DRAM information.

FIG. 2B shows two bits of storage on adjacent rows within a cell array. One of the side effects of the close physical proximity of the adjacent cell capacitors is when a row is updated, say row i, charge of $C_i$ can migrate to an adjacent cell capacitor $C_j$. During normal DRAM operation, the frequency of row accesses is low enough so that charge migration to an adjacent cell will not result in a change in the stored value before row refresh occurs. However, other factors such as exposure to radiation may increase the probability of a bit change in DRAM cells. The possibility of this type of memory fault or disturbance error was first identified in the early 1970s.

It has been demonstrated that disturbance errors in DRAMs can be induced by rapidly accessing a target row within the cell array which can then result in bit errors in adjacent rows of the cell array. This forcing technique is known as the Row Hammer Effect ("RHE"). In 2014, Google's Project Zero found two computer memory access privilege exploits based on the use of RHE and new exploits continue to be found. Consequently, much effort has been expended to find methods to mitigate RHE without much success.

Accordingly, there is a need for Row Hammer Effect mitigation devices and methods with minimal impact on form factor or significant increases in overall data access time or change in operation.

SUMMARY

In one embodiment, herein disclosed is a dynamic random access memory (DRAM) system configured to mitigate row hammer effect through dynamic row address mapping. A DRAM array with a plurality of rows each configured for storing data is provided. The DRAM array is connected to a dynamic mapping row decoder that is configured for storing a virtual row address for each of the plurality of rows and a state value for each of the plurality of rows wherein the state value is one of an active state and an inactive state. Control logic is provided to ensure data is never written back to the same row from which the data was immediately previously read.

In one implementation, the control logic is configured for changing the state value of the row from which data is read to an inactive state, and changing the virtual row address and the state value to the active state of the row to which the data is written. In such implementations, the control logic comprises a read operation and a write operation. In read operation, the control logic compares, for a read-target row, a matching virtual row address stored in the dynamic mapping row decoder that also has a state value in the active state to identify a target virtual row address for the read operation. Once the data is read, the control logic changes the state value of the read-target row to the inactive state before the write operation. In the write operation, the control logic is configured for writing data to one of the plurality of rows in the inactive state that is not the same row from which the data was immediately previously read.

In an implementation, the dynamic mapping row decoder comprises of a virtual row address storage register for storing virtual row address and a row address state machine for storing the state value for each row. The control logic can receive a virtual row address for a memory access operation, identify a read-target row by matching the received virtual row address to the virtual row address stored in one of the plurality of virtual row address storage registers where the associated row access state machine indicates an active state, read data from the read-target row into the row buffer latch, update the state value in the row access state machine associated with the read-target row to the inactive state, write the data from the row buffer latch to one of the inactive rows, update the virtual row address in the virtual row address storage register for the one of the inactive rows to which the date was written, and update the state value in the row access state machine for the one of the inactive rows to which the date was written to the active state.

In one embodiment, row access state machine is implemented as a counter where the active state is ST0 and the inactive state comprises one of a plurality of inactive states ST1 to STN, where N is the number of inactive rows. In this implementation, for the write operation, the control logic writes the data to line having a state machine value of ST0, after the state values are decremented at the end of the read operation, which ensures that data is never written to the same row from which it was read.

In another embodiment, a method for dynamically mapping row addresses to mitigate row hammer effect in dynamic random access memory (DRAM) is provided. The method comprises of providing a DRAM array with M-active rows and N-inactive rows, reading data from one of the M-active rows, and writing the data to one of the N-inactive rows, wherein the data is not written to the same row from which the data is read.

In one implementation, the method comprises providing a dynamic mapping row decoder, which can comprise of a virtual row address storage register for storing a virtual row address for each M-active rows and N-inactive rows and a row access state machine with a state value corresponding to an active state for each of M-active rows and an inactive state for each of the N-inactive rows. The method includes receiving a read-target row with a virtual row address corresponding to one of the M-active rows, reading the data from the read-target row, writing the data from the read-target row to one of the N-inactive rows, setting the state value of the row access state machine for the read-target row to the inactive state, and setting the state value for the one of the N-inactive rows to which the data is written to an active state.

In another embodiment, the row access state machine is implemented as a counter wherein the active state is represented by ST0 and the inactive states are represented by one of ST1 to STN, where N is the number of inactive rows. The method can include updating the state value of the row access state machine for the read-target row to STN after the data is read from the read-target row. The method can also include updating the state value of the row access state machine for the other inactive rows, where updating the state value of the row access state machine for the other inactive rows is in a decreasing order from STN−1 to ST1.

BRIEF DESCRIPTION OF THE DRAWINGS

These and other features and advantages of the present invention will be better understood by reading the following detailed description, taken together with the drawings wherein.

DETAILED DESCRIPTION

Figure 14:
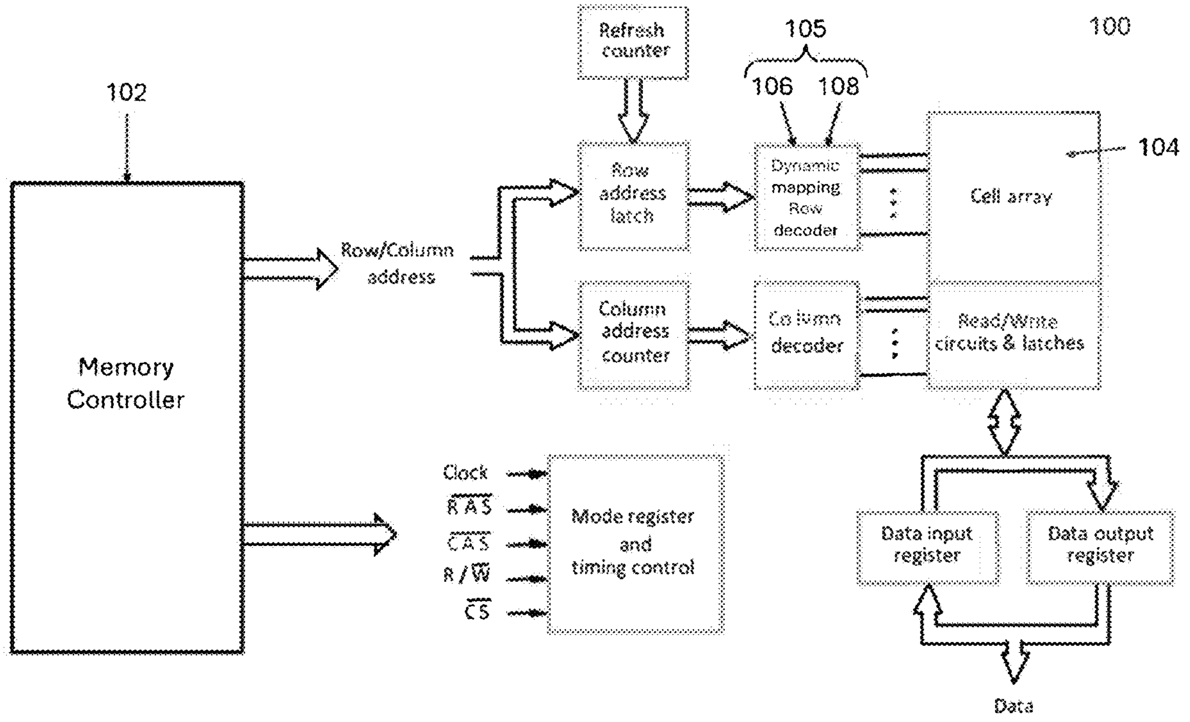
FIG. 14 is a block diagram of the DRAM system according to this disclosure.

FIG. 14 shows a dynamic random-access memory (DRAM) system 100 according to this disclosure. DRAM system 100 is configured for dynamically mapping row addresses to mitigate the Row Hammer Effect (RHE) that occurs from successive reading and writing data to the same the same row. This implementation ensures that data is never written to the same row from which it is read. Unlike existing techniques that attempt to mitigate row hammer effect by refreshing neighboring rows of frequently accessed rows, this disclosure solves the problem through systems and methods configured to redirect all write operations to a different row from the date is read. This is accomplished by incorporating inactive, inactive rows so that data read from one row is subsequently written to the inactive, inactive row.

DRAM system 100 comprises a memory controller 102 that manages the flow of data between a processor and a DRAM 100. DRAM 100 can comprise of the general components described in the context of SDRAM 10, including row address latch 16, column address counter 18, read/write circuits and latches 26, data input and output registers 28, and clock circuit 30. In this implementation, however, row decoder 22 is replaced with a dynamic mapping row decoder 105, which can comprise of a virtual row address storage register 106 and a row address state machine 108, which will be described in further detail below. Dynamic mapping row decoder 105 is connected to DRAM array 104.

Figure 1:
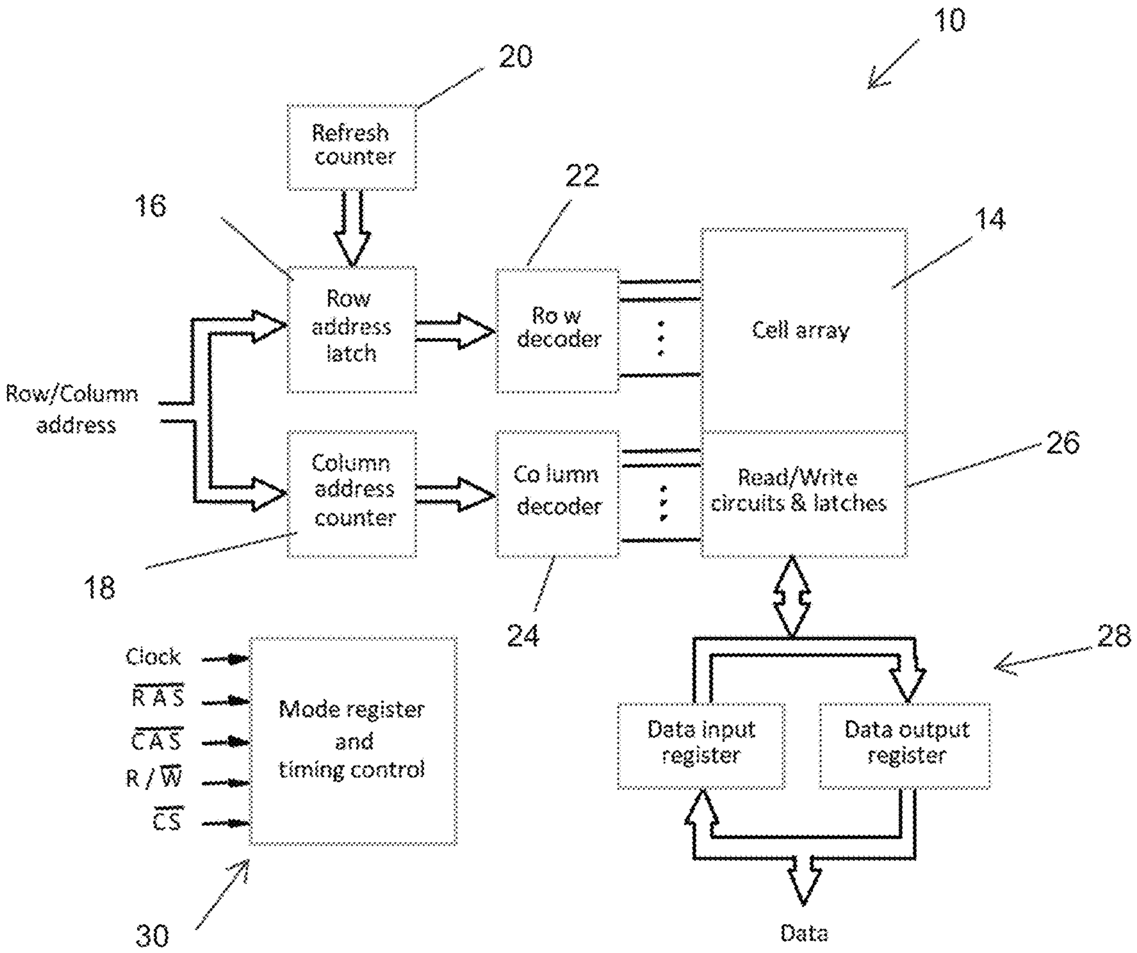
FIG. 1 (PRIOR ART)
FIG. 1 is a high-level functional block diagram of a DRAM of the prior art.
Figure 2A:
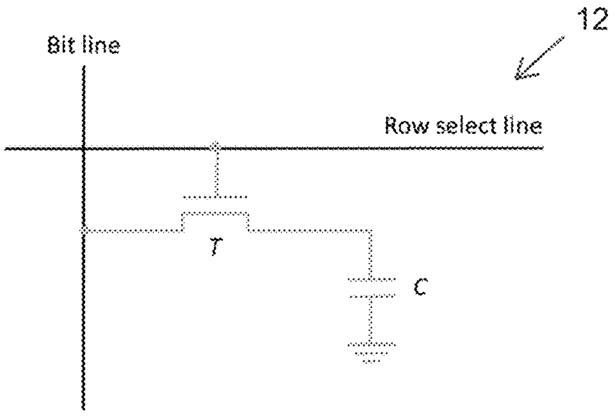
FIG. 2A (PRIOR ART)
FIG. 2*a* illustrates a single bit of DRAM storage of the prior art.
Figures 2A, 2B:
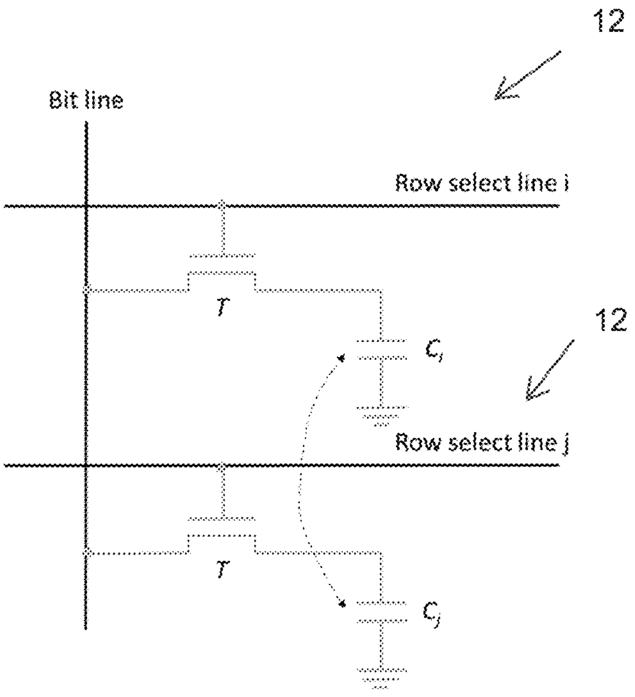
FIG. 2A (PRIOR ART)
FIG. 2B (PRIOR ART)
FIG. 2*b* illustrates two bits of DRAM storage of the prior art.

Memory controller 102 acts as the central hub managing data flow between the processor and DRAM array 104. In conventional DRAM, such as Synchronous DRAM (SDRAM) or Double Data Rate (DDR) DRAM e.g., DDR4 or DDR5, the memory controller facilitates communication by receiving memory access requests from the processor, specifying a row address, column address, and operation type (read or write). The controller translates the requests into DRAM-specific commands, such as Row Address Strobe (RAS), Column Address Strobe (CAS), READ, WRITE, and REFRESH, consistent with industry standards such as those set by JEDEC for DDR5 and as described above in the context of FIG. 1. These commands are sent over a command bus, synchronized with a clock signal to ensure precise timing.

For address translation, memory controller 102 maps the processor's logical memory addresses to physical DRAM addresses, which consist of bank, row, and column components. In standard DRAMs, the row address corresponds directly to a fixed physical row in DRAM array 104, selected through a row decoder. During a READ operation, memory controller 102 activates the specified row, retrieves the data into a row buffer, and sends the requested portion to the processor via the data bus. For a WRITE operation, it updates the row buffer with new data from the processor and writes the modified row buffer back to DRAM array 104. These transfers are carefully scheduled to meet timing constraints, such as row access time and column access time.

Additionally, since DRAM cells store data as charges in capacitors that leak over time, memory controller 102 can still periodically issues REFRESH commands to read and rewrite each row within a specified retention time, typically 64 milliseconds for DDR4, to prevent data loss. These refreshes may be performed in auto-refresh or self-refresh modes and are scheduled to minimize interference with read and write requests, often using auto-refresh or self-refresh modes. Memory controller 102 also ensures compliance with DRAM timing parameters, like row cycle time and refresh interval, and may support error correction codes (ECC) to detect and correct bit errors. It should also be noted that refresh operations may now be eliminated to conserve resources.

Memory controller 102 is communicatively coupled to dynamic mapping row decoder 105. This coupling can occur directly or indirectly through other components, as illustrated. Dynamic mapping row decoder 105 can comprise virtual row address storage register 106 and row address state machine 108. Each row in DRAM array 104, including both active rows and inactive rows, contains virtual row address storage register 106 that holds the virtual row address assigned to that physical row. FIGS. 3-13 illustrate dynamic mapping row decoder 105 connected to storage array 104. For a DRAM with M active rows and N inactive rows, there are M+N registers, with active rows initially assigned virtual addresses from 0 to M−1 and inactive rows initialized to a common value, which is typically 0. At system startup or reset, memory controller 102 initializes these registers by assigning the appropriate virtual addresses to active rows 110 and setting inactive row addresses 112 to 0 (or another common value). Initialization may occur through a dedicated command sequence or as part of the power-on process, coordinated with the DRAM's internal control logic. Under conventional practice virtual addresses may range from 0 to M−1, but other mappings may be used. For example, addresses could range from 1 to M with inactive rows initialized to 1.

Row access state machine 108 tracks whether the row is active, denoted by state ST0, or an inactive row, denoted by states ST1 to STN. Memory controller 102 initializes the state machine by setting active rows to ST0 and inactive rows to states ST1 through STN, corresponding to the number of inactive rows. For example, in DRAM array 104 with three inactive rows, the inactive rows are set to ST1, ST2, and ST3. During operation, memory controller 102 may, but does not have to, directly manage row access state machine 108, but triggers updates indirectly through standard DRAM commands. When a memory access begins, memory controller 102 issues, for example, a RAS command with a virtual row address V, internal comparison logic, possibly implemented as content-addressable memory or parallel comparators, looks for a match between this virtual row address V stored in virtual row address storage register 106 and the physical row address P and with a state value in the active state ST0. The reason for requiring both conditions is to prevent confusion between virtual row 0 and inactive rows whose registers also store 0 (if 0 is used for the common value). Inactive row is represented by an inactive state in row access state machine 108, a state not equal to ST0 in this example. Turning back to the sequence of operations, the matching row, say row T, is selected, and its data is read into a row buffer. This process mirrors standard DRAM operation but incorporates programmable mapping via DRAM system 100's internal logic, leaving the role of memory controller 102 unchanged and compatible with existing DRAM interfaces.

After the READ operation, the DRAM system's 100 internal logic updates row access state machine 108 without direct intervention from memory controller 102. The state of row P (the row just accessed) is set to SN, marking it as an inactive row, while the states of other inactive rows are decremented, for instance, from ST3 to ST2, ST2 to ST1, and ST1 to ST0. The row that transitions to ST0, say row Q, has its virtual row address storage register updated to the virtual address, becoming the new active row for that virtual address. For a write operation, memory controller 102 updates the row buffer with new data from the processor and issues a WRITE command. DRAM system 100 then writes the row buffer data to row Q, the new active row. For a read operation, memory controller 102 retrieves the data from the row buffer, and DRAM system 100 writes the unmodified row buffer back to row Q. This dynamic reassignment ensures that repeated accesses to the same virtual row address target different physical rows, reducing the risk of RHE-induced disturbance errors.

Figure 3:
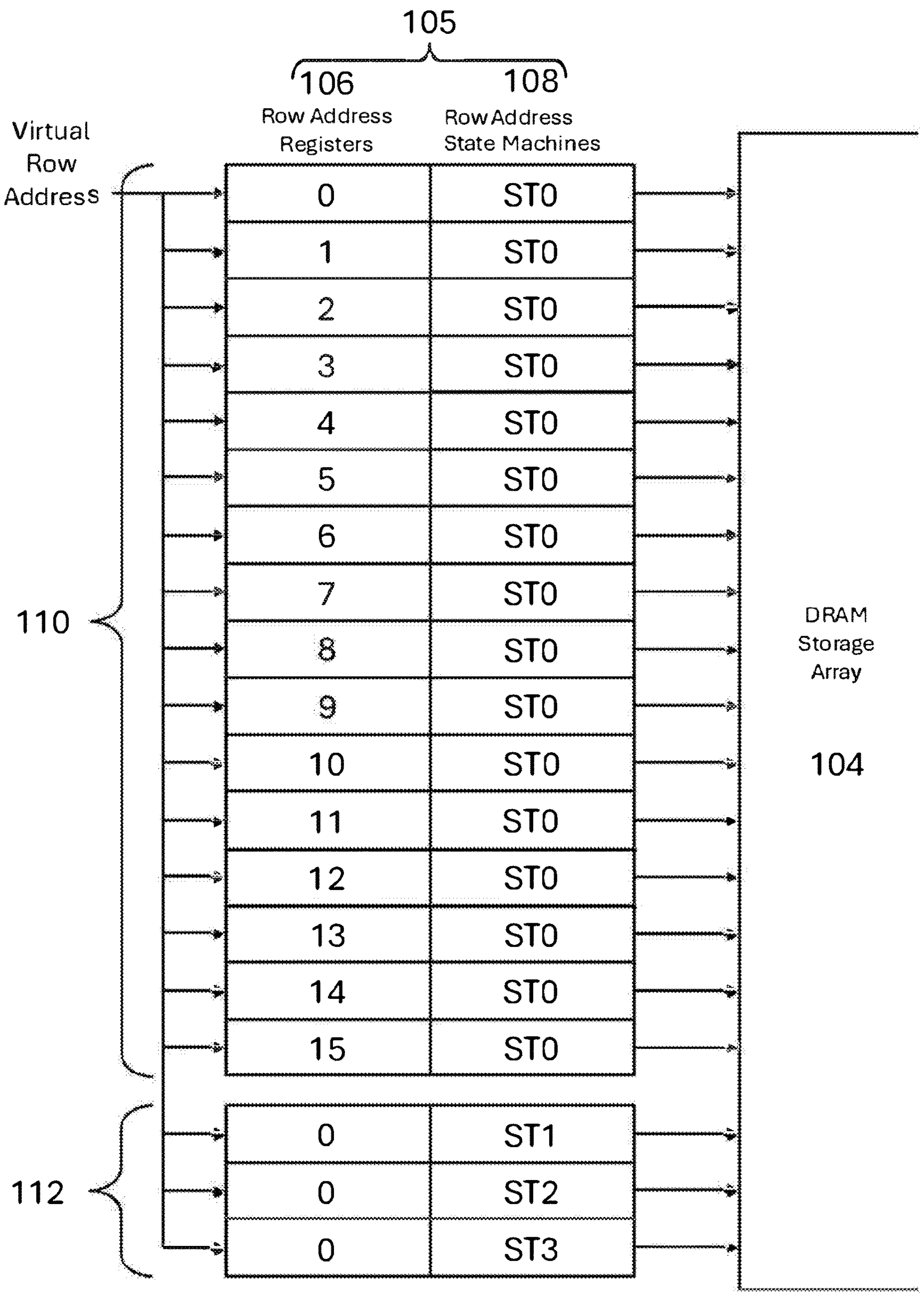
FIG. 3 is high level block diagram of DRAM system with a virtual row address storage register and a row access state machine upon initialization according to this disclosure.

The operations of dynamically mapping row addresses to mitigate RHE in DRAM system 100 will be illustrated in FIGS. 3-12 using a simplified example of an 18 row DRAM array 104 with sixteen addressable rows 110 (0-15) and three inactive rows 112 ST1-ST3. FIG. 3 shows initialization of DRAM system 100 with virtual row address storage register 106 initialized with a virtual row address corresponding to the physical row address of addressable rows 0-15 and inactive rows 112 set to zero (0). The row access state machine 108 is initialized with all of the addressable rows 110 set to an active state (ST0) and all of inactive rows 112 set to an inactive state (ST1 to ST3).

Although the example shown in FIG. 3 shows the inactive rows after the active rows, in reality, the only difference between the active rows and the inactive rows are the initial values assigned to virtual row address storage registers 106 and the row access state machine 108.

Figure 4:
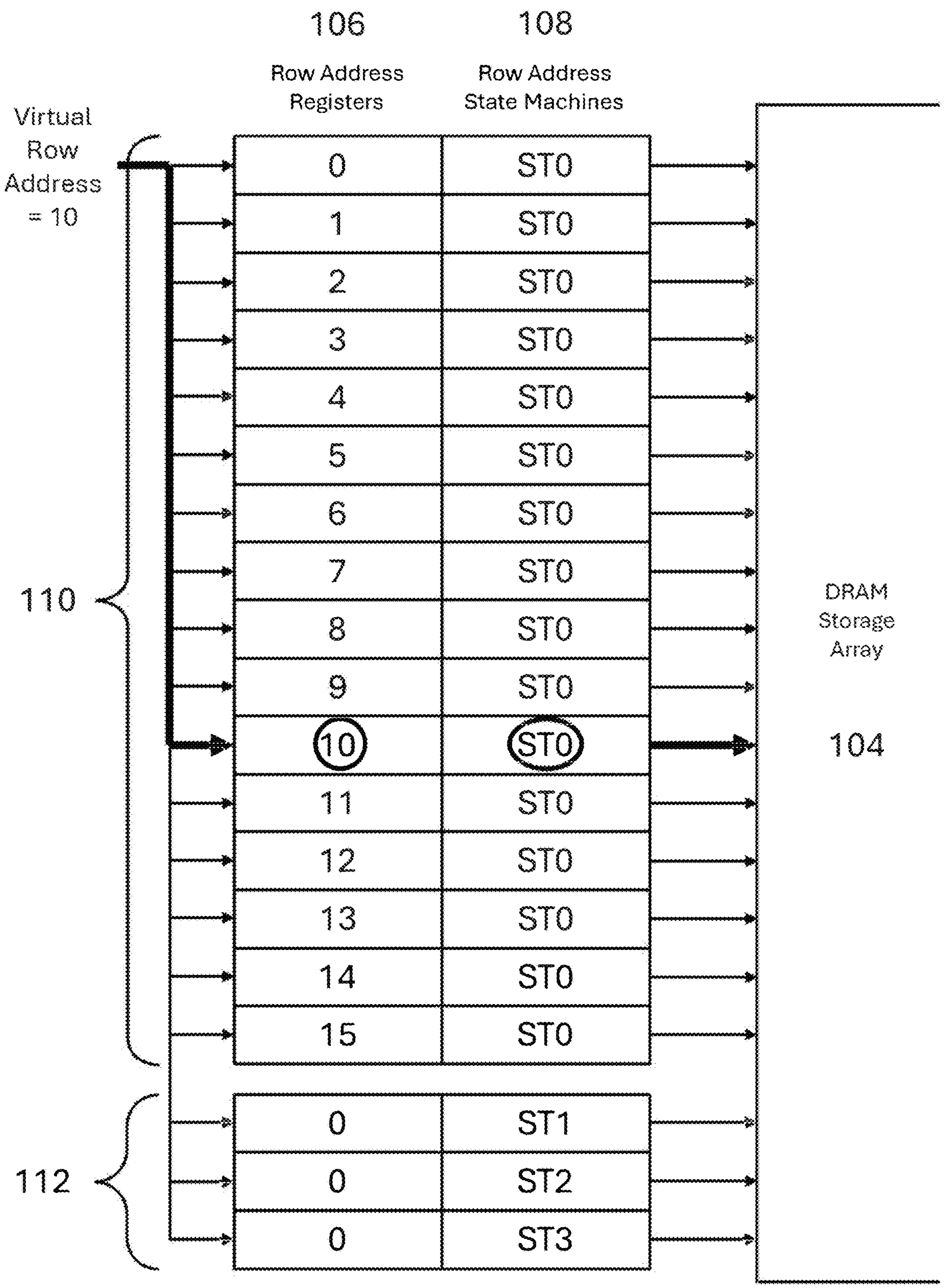
FIG. 4 is the DRAM system of FIG. 1 illustrating a reading operation of physical row 10.
Figure 5:
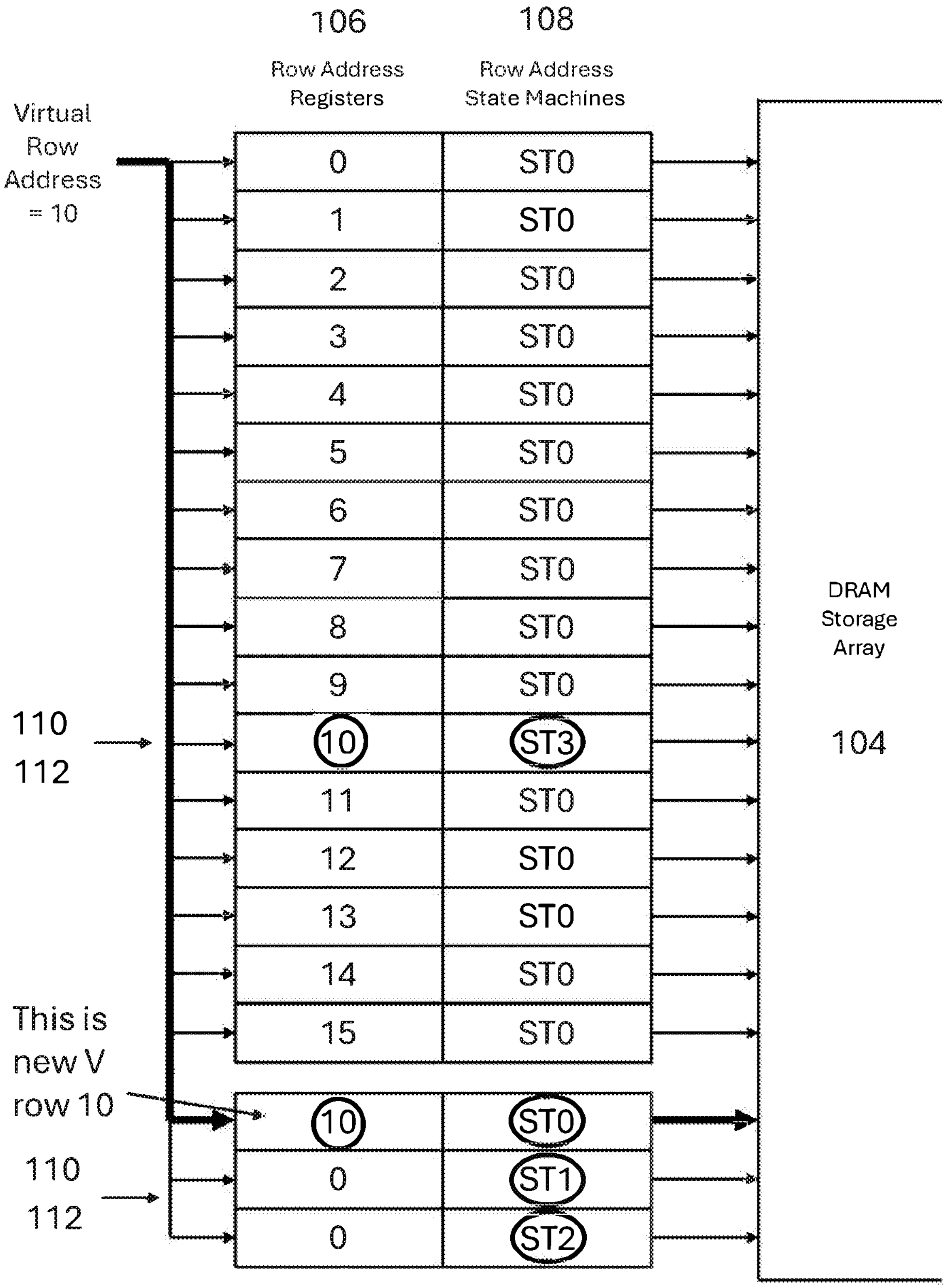
FIG. 5 is the DRAM system of FIG. 1 illustrating an updating of the virtual row address storage register and the row access state machine following a writing operation of the data from row 10 to an inactive row.

FIG. 4 shows an access to virtual row address 10. The row whose register stores virtual address 10 and is in state ST0 is selected, and its data is read from DRAM array 104 into the row buffer. At the end of the READ, as shown in FIG. 5, the state for row 10 in row access state machine 108 is set to SN (in our example ST3), and the state values for other inactive rows are decremented (ST3→ST2, ST2→ST1, S1→ST0). The row that transitions to ST0 becomes the new active row for virtual address 10, and its register is updated accordingly. The data is then written back to DRAM array 104, but now into the new active row for that virtual address. This means that the designated inactive rows can be evenly distributed throughout the memory storage array.

In looking at FIG. 5, it may be noted that virtual row address storage register 106 contains two addresses for virtual row 10. Virtual row address storage register 106 does not have to be reset after each WRITE operation. Because virtual row address 10 is recognized as having the active state ST0 rather than the virtual row address 10 with the inactive state ST3. The row address noted with virtual address 10 and inactive state ST3 can have its virtual row address reset to 0, but it is not required.

Figure 6:
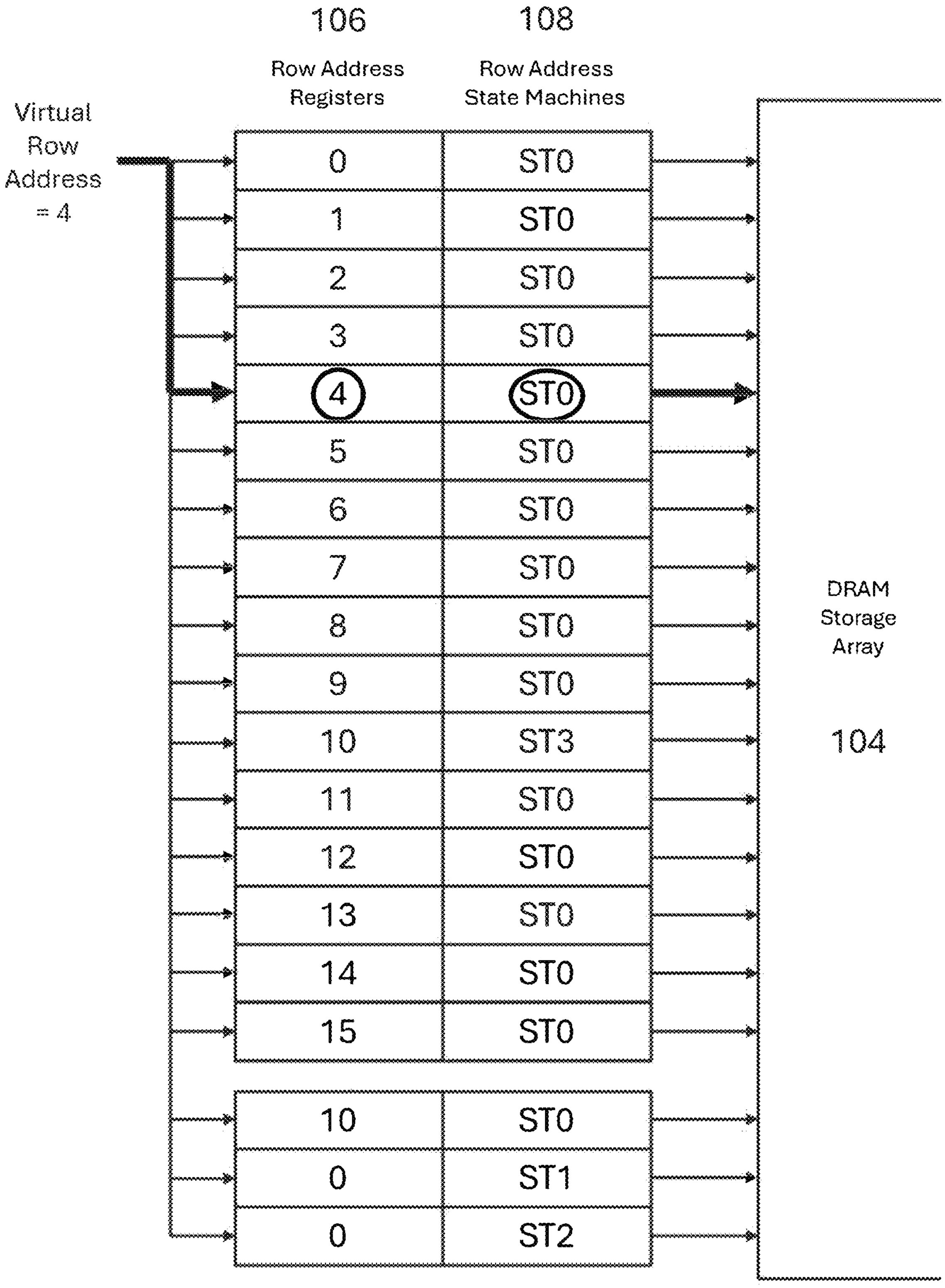
FIG. 6 is the DRAM system of FIG. 1 illustrating a subsequent reading operation of physical row 4.
Figure 7:
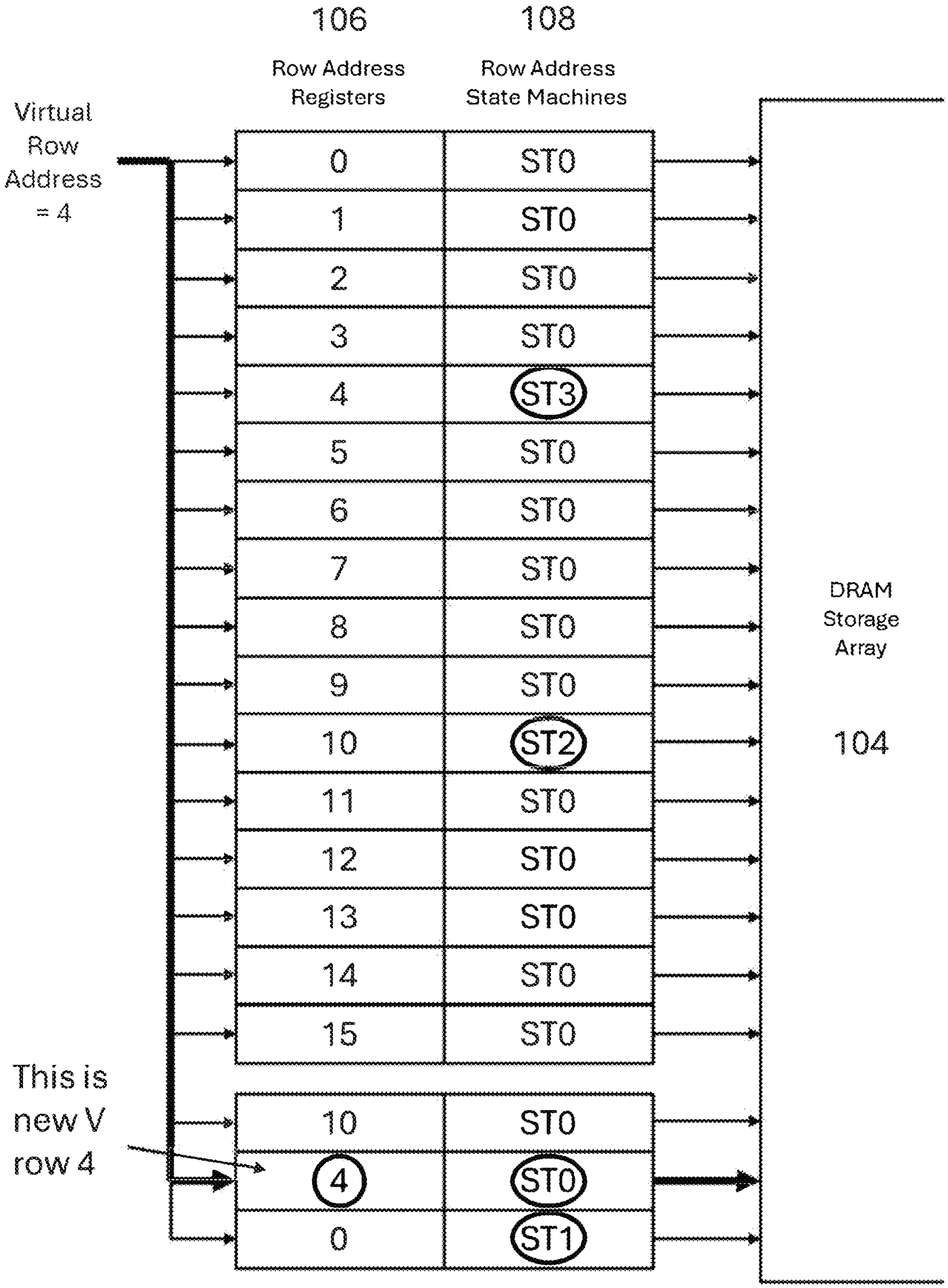
FIG. 7 is the DRAM system of FIG. 1 illustrating an updating of the virtual row address storage register and the row access state machine following a writing operation of the data from row 4 to an inactive row.
Figure 8:
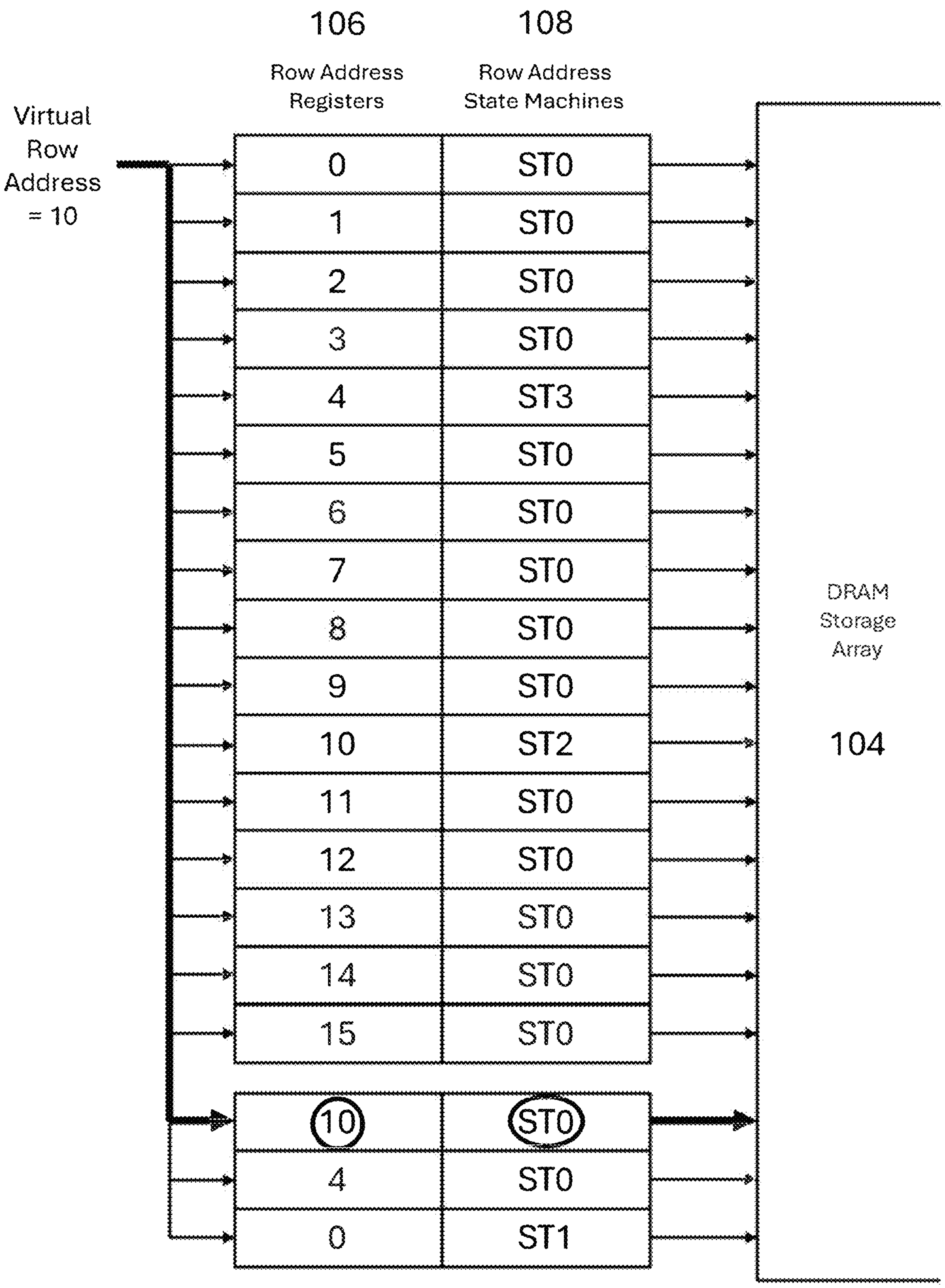
FIG. 8 is the DRAM system of FIG. 1 illustrating a subsequent reading operation of the data in virtual row 10.
Figure 9:
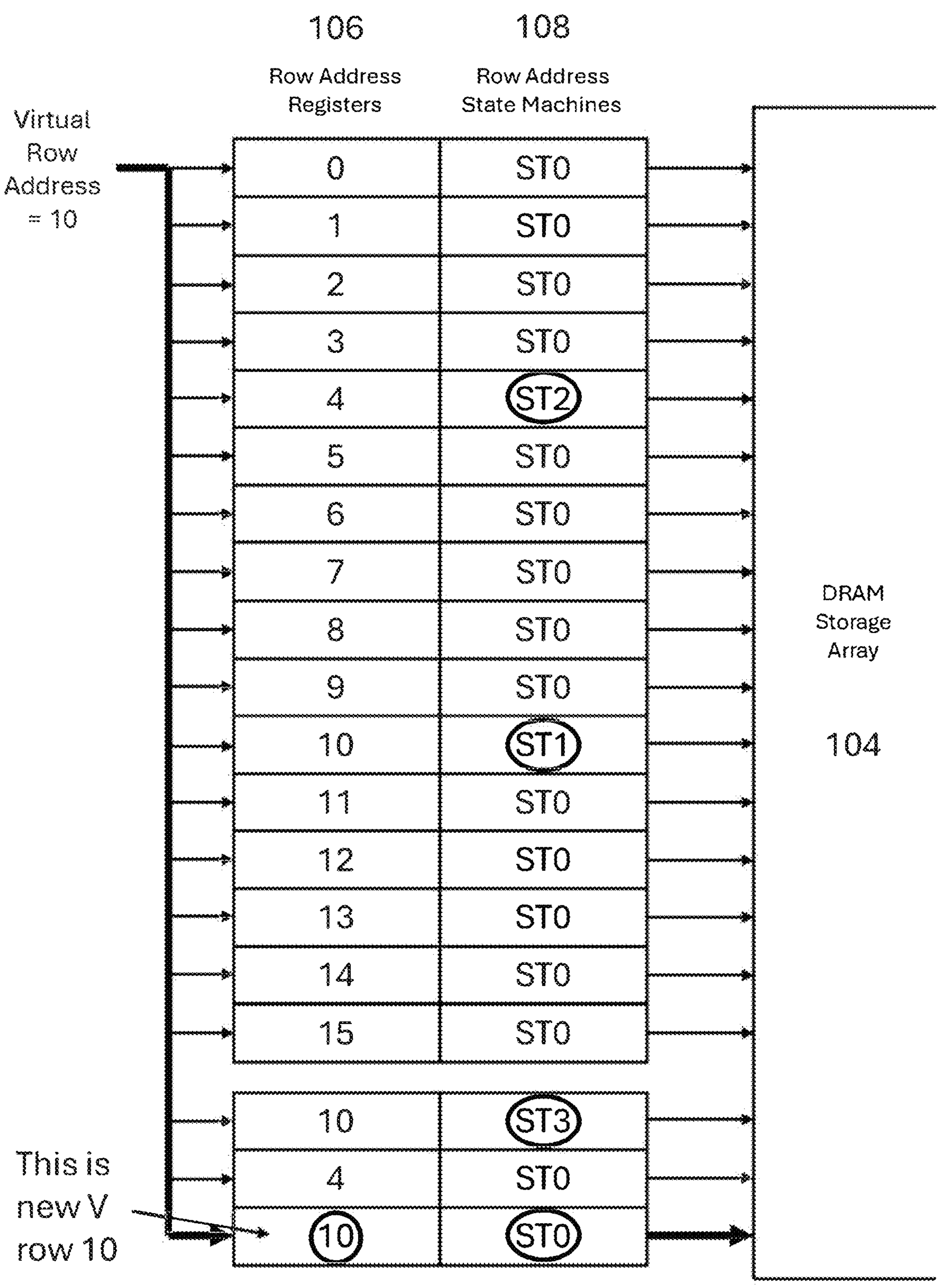
FIG. 9 is the DRAM system of FIG. 1 illustrating an updating of the virtual row address storage register and the row access state machine following a writing operation of the data from virtual row 10 to an inactive row.
Figure 10:
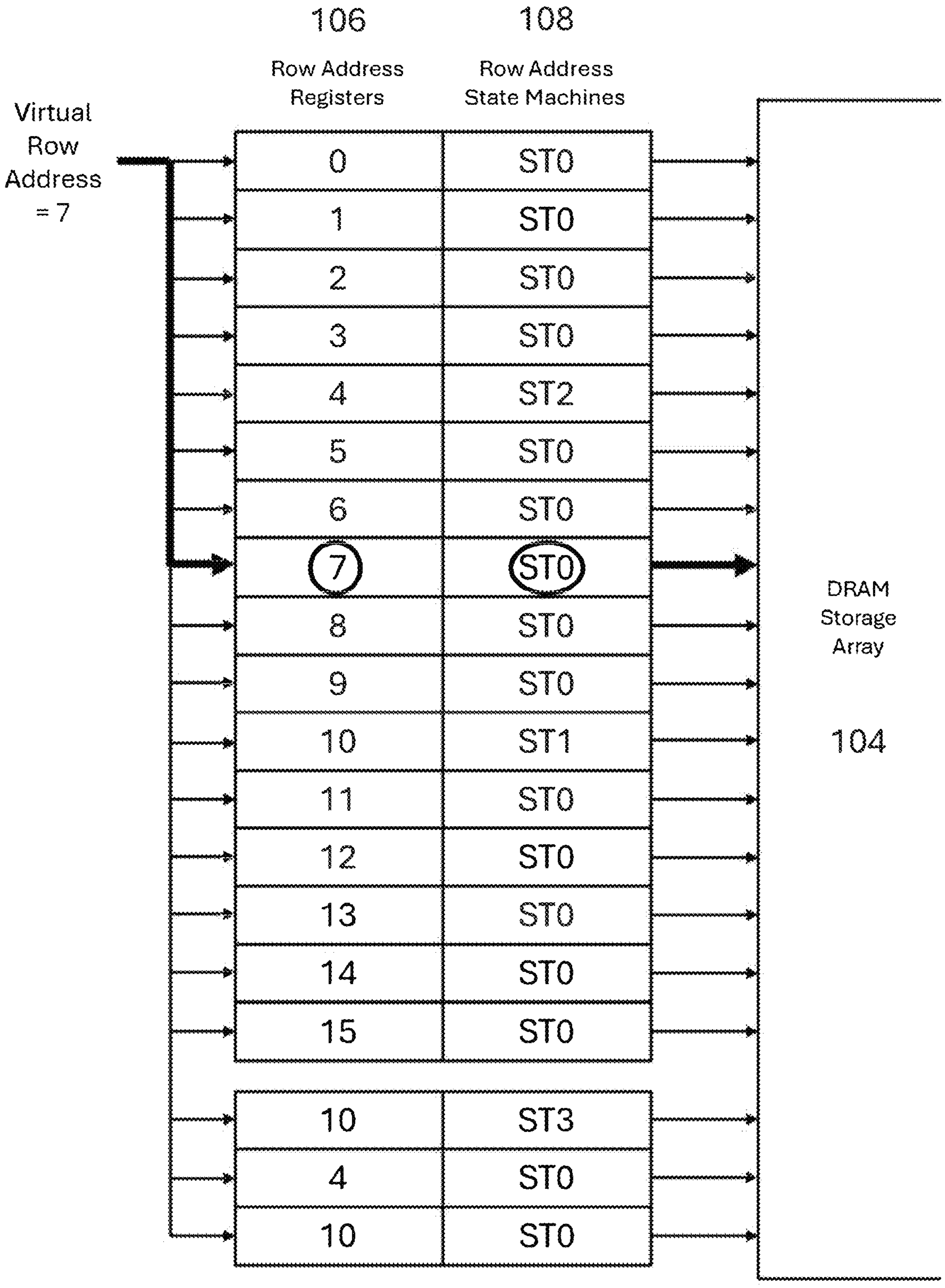
FIG. 10 is the DRAM system of FIG. 1 illustrating a subsequent reading operation of the data in row 7.
Figure 11:
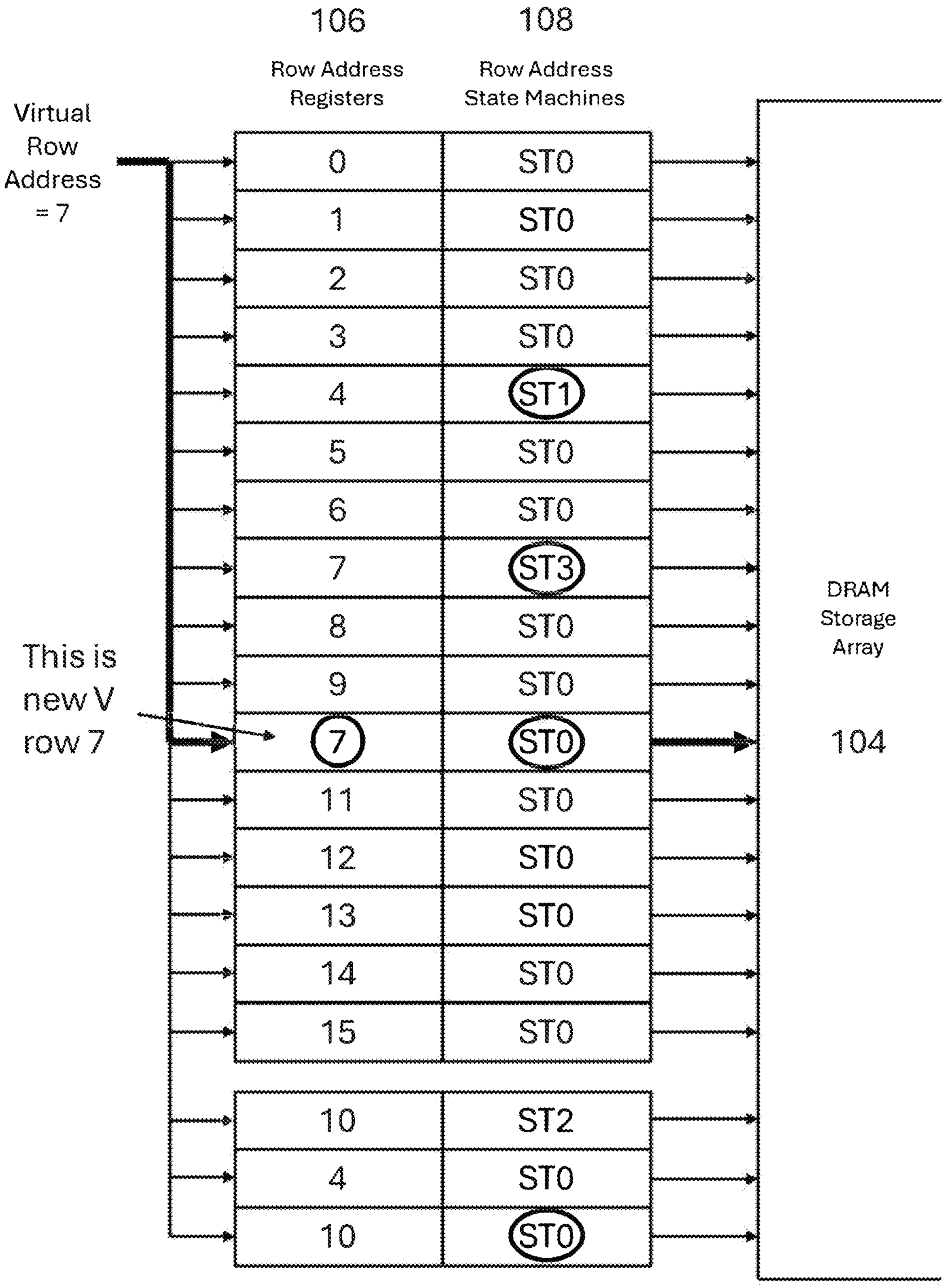
FIG. 11 is the DRAM system of FIG. 1 illustrating an updating of the virtual row address storage register and the row access state machine following a writing operation of the data from row 7 to an inactive row corresponding to physical row 10.
Figure 12:
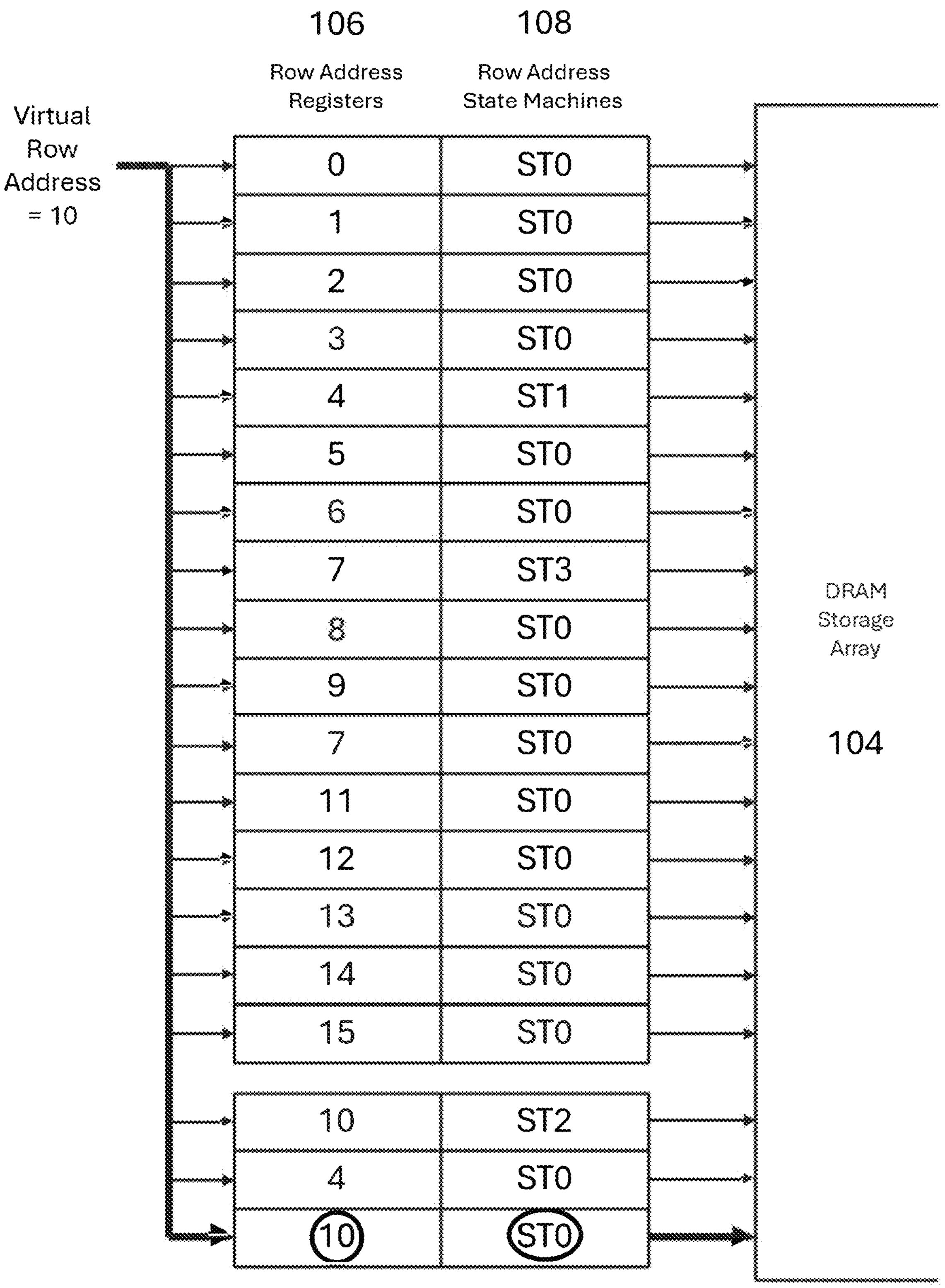
FIG. 12 is the DRAM system of FIG. 1 illustrating a subsequent reading operation of the data in physical row 18 and virtual row 10.
Figure 13:
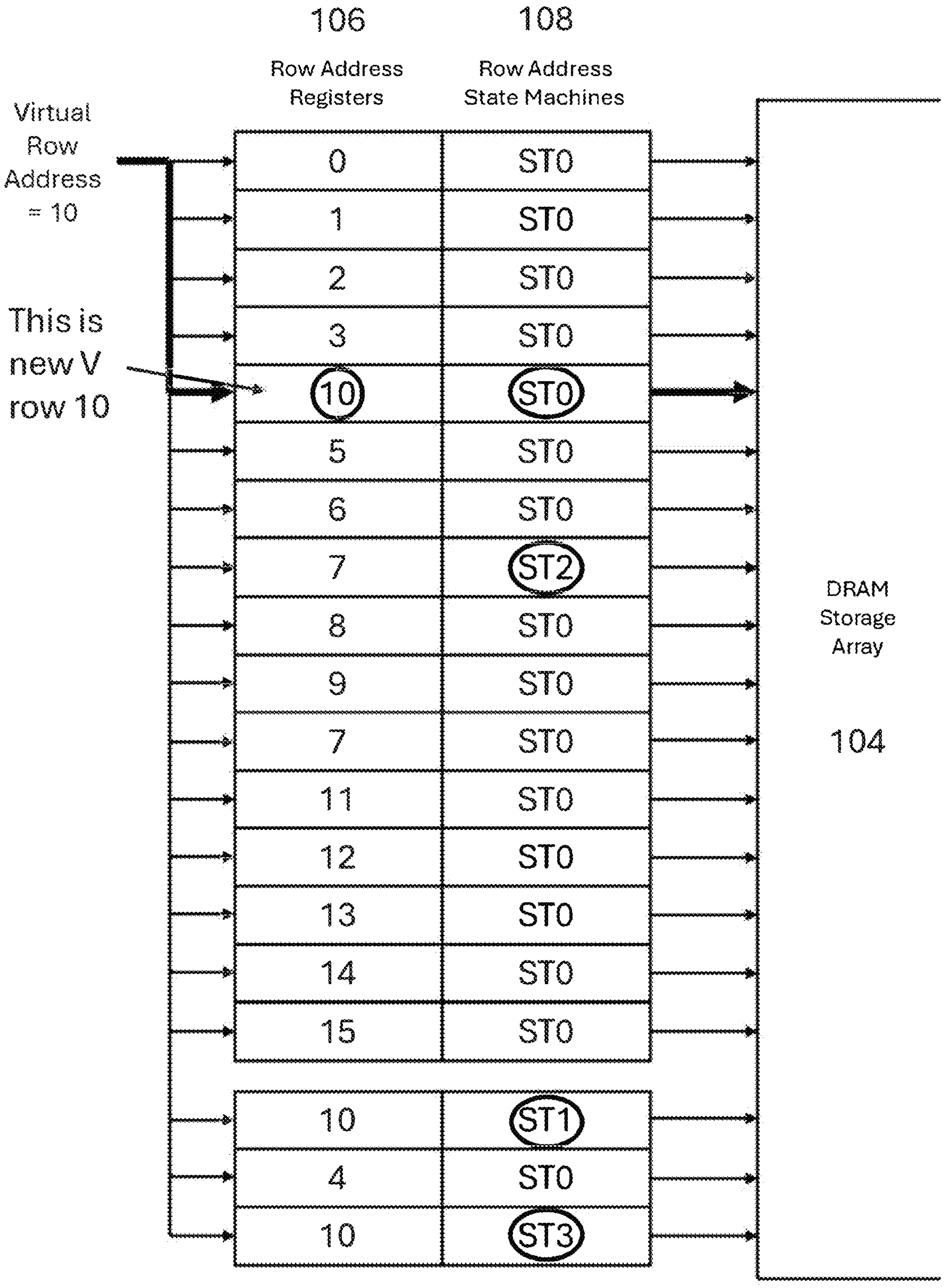
FIG. 13 is the DRAM system of FIG. 1 illustrating an updating of the virtual row address storage register and the row access state machine following a writing operation of the data from physical row 18 and virtual row 10 to an inactive row corresponding to physical row 4.

Operation of the programmable row address decoder is further demonstrated in FIGS. 6-14. These show the access of row 4, row 10 the second time, row 7 and finally row 10 the third time. Even though virtual row 10 is accessed three times, each access selects a different physical row in the array. FIG. 6 shows virtual row address 4 of virtual row address storage register 106 being selected as the new target row for the READ operation. At the WRITE operation of FIG. 7, row address state machine 108 is updated to change original row address 4 to an inactive state ST3 and WRITE the contents for that row to an inactive row designating it as a new virtual row 4 and an active state ST0. This process continues in FIG. 8 with data READ from virtual row address 10 that is in active state ST0 and, in FIG. 9, in a WRITE operation to an inactive row changing it to virtual row address 10 in an active state ST0 and changing the previous virtual row address 10 to an inactive state ST3. The process continues in FIG. 10 with a READ operation on virtual row address 7, and a WRITE operation in FIG. 11 to an inactive row that is changed to new virtual row address 7 in an active state ST0 with the prior virtual row address 7 changed to an inactive state ST3. In the last operation, the process continues in FIG. 12 with another READ operation on virtual row address 10 in active state ST0, to a WRITE operation in FIG. 13 to an inactive row that becomes the new virtual row address 10 in active state ST0 with the prior virtual row address 10 changing to an inactive state ST3.

Virtual row address storage register 106 is a digital storage element associated with each row in DRAM array 104. Each of the M+N registers stores the virtual row address assigned to its corresponding physical row, enabling DRAM system 100 to map an externally supplied virtual row address to the correct physical row during memory access. As described above, upon initialization, memory controller 102 configures the registers so that active rows (0 to M−1) are assigned virtual addresses matching their row indices (e.g., row 0 stores address 0, row 1 stores address 1, etc.), while inactive rows (M to M+N−1) are set to 0, indicating no virtual assignment. During operation, when a virtual row address V is provided via a RAS command, the DRAM's comparison logic matches V against the contents of registers associated with rows in state ST0. When a match is found, the corresponding physical row is selected for reading. After the READ, the virtual row address is reassigned to a new physical row (a former inactive row) by updating its register, under control of row access state machine 108.

The primary implementation of virtual row address storage register 106 is as a volatile digital register integrated into the DRAM die's row circuitry. Each register stores a binary value representing the virtual row address, with a bit width sufficient to represent all possible addresses (e.g., 10 bits for a 1024-row array, allowing 0-1023). Virtual row address storage register 106 is implemented in standard CMOS using flip-flops or latches to provide reliable storage and fast access. Each register is tied to DRAM internal control logic that manages its read/write operations during initialization and dynamic row mapping. For example, in a DRAM with 16 active rows and 3 inactive rows, rows 0-15 are initialized to virtual addresses 0-15, while rows 16-18 are set to 0. When a row is read, its register (e.g., row 10 with virtual address 10) remains unchanged; after the READ, however, row access state machine 108 triggers a reassignment. An inactive row transitioning to S0 (e.g., row 16) has its register updated to the virtual address (e.g., 10), while the original row's register may be cleared or left unchanged as it becomes inactive.

Virtual row address storage register 106 prioritizes speed so as not to impact DRAM access time, typically operating within the row access cycle (e.g., <1 ns for DDR5). It is implemented as part of the row decoder circuitry and tightly coupled with comparison logic, which may use CAM or parallel comparators. The register supports READ/WRITE operations during normal DRAM cycles, ensuring dynamic remapping occurs within the row cycle. Power use is minimized with low-power CMOS circuits, and the die-area overhead is small. Because the registers are volatile, their contents are cleared on power loss and reinitialized at startup, consistent with standard DRAM initialization.

The key to any alternative embodiments is to maintain the core function of virtual row address storage register 106: to store and update the virtual row address assigned to a physical row, enabling dynamic mapping to mitigate RHE. The primary implementation using volatile CMOS registers provides a balance of speed, simplicity, and process compatibility. Alternative embodiments can be used for low-power devices, high-reliability systems, or large-scale arrays. The choice of implementation depends on factors such as the DRAM standard (e.g., DDR4, DDR5), performance needs, and cost constraints, ensuring adaptability while still mitigating RHE-induced errors.

Row access state machine 108 in DRAM system 100 is designed to mitigate the Row Hammer Effect (RHE) through dynamic row address mapping. Each state machine of row access state machine 108 tracks the status of its corresponding row, determining whether it is active (state S0) or an inactive row (states S1 to SN, where N is the number of inactive rows). Implemented as a hardware-based finite state machine using CMOS logic, row access state machine 108 consists of a small set of flip-flops or registers to store the current state, coupled with combinational logic to handle state transitions. At initialization, memory controller 102 configures the states, setting active rows (0 to M−1, where M is the number of active rows) to S0 and inactive rows (M to M+N−1) to ST1 through STN. During a memory access, when a row P (state ST0) is read, the state machine updates its state to SN, marking it as an inactive row, while the states of other inactive rows are decremented (e.g., ST3 to ST2, ST2 to ST1, ST1 to ST0). The row transitioning to ST0 becomes the new active row, receiving the virtual row address. This process, managed by the DRAM system's 100 internal control logic, ensures low-latency updates (e.g., <1 ns for DDR5) with minimal die area increase, typically 5-10% alongside other components.

Alternative embodiments of row access state machine 108 include a software-based implementation, where state transitions are managed by firmware in memory controller 102, reducing per-row hardware but increasing latency due to external communication. Another variation uses a counter-based state machine, where a counter increments or decrements within the range 0 to N, simplifying the logic but requiring careful synchronization. A centralized state machine managing all rows could also be employed, storing states in a shared memory block to reduce per-row circuitry, though this may introduce contention in high-speed accesses. These embodiments maintain row access state machine's 108 core function of cycling rows between active and inactive states to prevent repeated hammering, offering flexibility for different DRAM architectures, performance needs, or manufacturing constraints while ensuring compatibility with standards like DDR4 and DDR5.

Alternative types of state machines that can be employed for the row access state machine 108 include ring counters, which utilize a shift register configuration to cycle through states with a single active bit, ensuring straightforward and reliable transitions. Twisted ring counters, also known as Johnson counters, provide twice the number of states compared to standard ring counters by inverting the feedback, allowing for efficient encoding with minimal hardware while maintaining sequential progression without errors. Other alternatives that transition from state to state without error are contemplated.

This disclosure uses the concept of inactive row 112 to manage dynamic row mapping. Inactive row 112 should be distinguished from unused rows in DRAM and should not be confused with redundant rows incorporated during manufacture for defect mitigation. Production-time inactive rows are permanently mapped to replace faulty rows and are generally inaccessible post-manufacture except during repair (e.g., post-package repair). In contrast, inactive rows 112 here actively participate in normal operation, dynamically managed by DRAM internal logic and identified by their state in row access state machine 108.

The number of inactive rows N is determined probabilistically to ensure that the probability of the Row Hammer Effect (RHE) resulting in a memory disturbance fault, which is defined as a bit flip or data corruption in an adjacent row due to excessive activations of a physical row, remains below a specified threshold. In other words, the number of inactive rows is determined based on a probabilistic model considering a row hammer threshold and a target bit error rate to maintain a probability of row hammer-induced disturbance errors below a predetermined threshold. This threshold is typically set based on overall system reliability requirements, such as achieving a target bit error rate (BER) of less than a predetermined value, accounting for factors like operating temperature, voltage variations, and manufacturing process tolerances. The probabilistic model considers the distribution of memory access patterns, the dynamics of the dynamic row mapping mechanism, and empirical data on the row hammer threshold H (the maximum number of row activations tolerable without inducing disturbances in adjacent rows). The number of inactive rows N is determined based on a probabilistic model considering a row hammer threshold and a target bit error rate to maintain a probability of row hammer-induced disturbance errors below a predetermined threshold.

More specifically, the most likely method for determining N, given M active rows, focuses on a conservative probabilistic model that protects against worst-case adversarial hammering while incorporating statistical bounds for reliability. The row hammer threshold is empirically determined for the specific DRAM technology. In the worst-case scenario of hammering a single virtual row (common in RHE exploits), the system cycles activations across N+1 physical rows (the initial assigned row plus N inactive rows), with each access contributing approximately two activations (one for reading the current row and one for writing to the new inactive row).

Figure 15A:
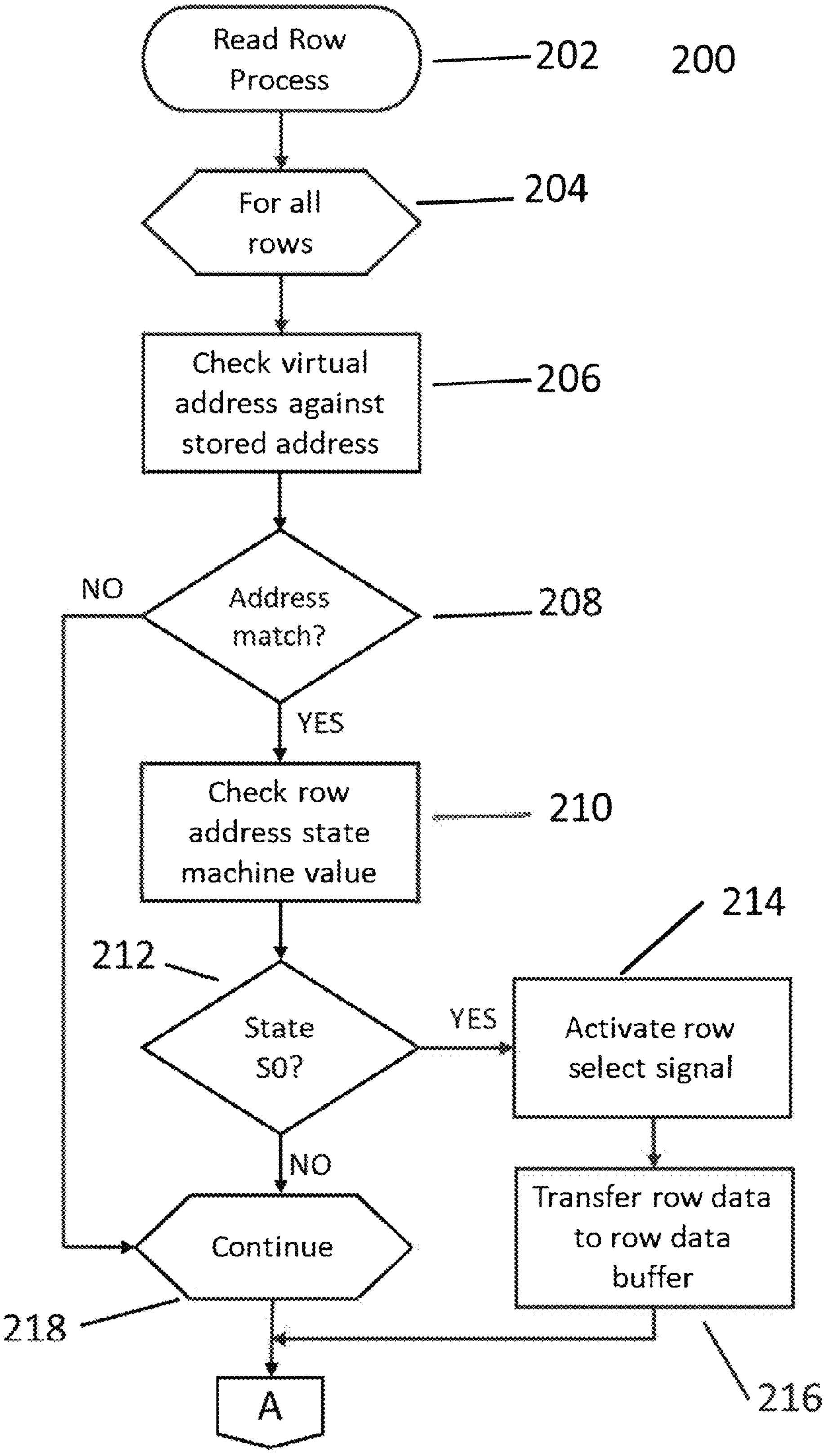
FIG. 15A is a flow chart illustrating a method for dynamically mapping row addresses to mitigate row hammer effect in dynamic random-access memory (DRAM) according to this disclosure.
Figure 15B:
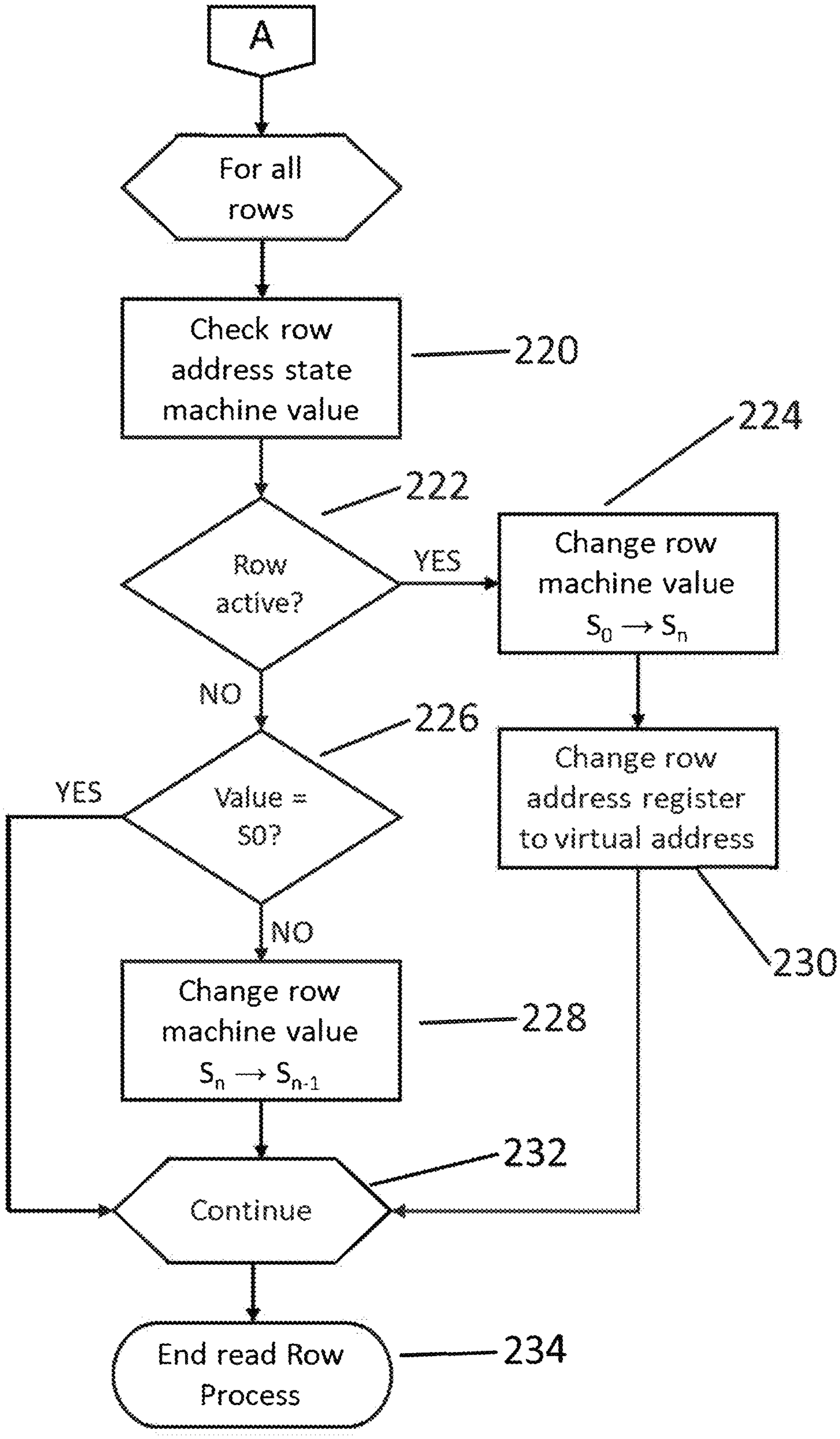
FIG. 15B is a continuation of flowchart in FIG. 15A.
Figure 15C:
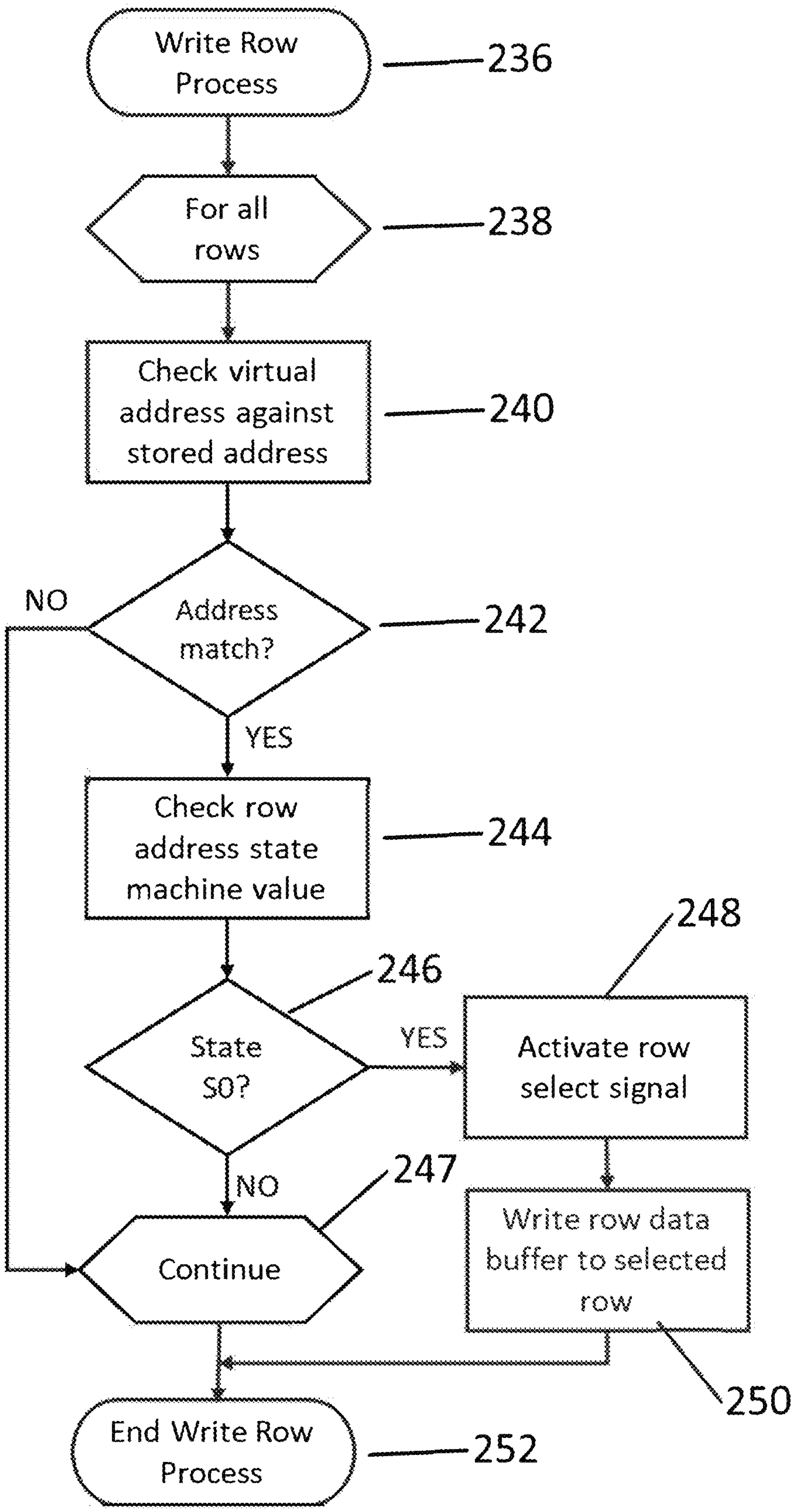
FIG. 15C is a continuation from flowchart in FIG. 15B.

FIG. 15A-C is a flow chart 200 illustrating a method for dynamically mapping row addresses to mitigate the row hammer effect in dynamic random access memory (DRAM)

according to this disclosure. The method ensures that data is never written back to the same physical row from which it was read, by dynamically reassigning virtual row addresses to different physical rows using inactive rows, virtual row address storage registers 106, and row access state machines 108. This dynamic mapping cycles activations across multiple physical rows for the same virtual address, reducing the frequency of accesses to any single physical row and thereby mitigating disturbance errors caused by the row hammer effect, consistent with the system architecture described in FIG. 14 and the operational examples in FIGS. 3-13.

FIG. 15 is divided into a Read Row Process (FIGS. 15A, 15B) and a Write Row Process (FIG. 15C), which together implement the dynamic mapping mechanism. The Read Row Process includes selecting the current physical row for a given virtual address, transferring data to the row buffer, and then updating the state machines and virtual address registers across all rows to reassign the virtual address to a new physical row (a former inactive row). The Write Row Process selects the newly assigned physical row and writes the (potentially modified) row buffer data to it. This ensures that writes are always directed to a different physical row than the read, cycling accesses across physical rows to reduce row hammer vulnerability. The loops over "all rows" may be implemented in parallel via hardware logic (e.g., CAM or comparators) for efficiency without impacting access time.

The method begins with the Read Row Process at block 202, starting the read operation for a received virtual row address. This initiates the sequence to identify and read the current physical row mapped to that virtual address, as part of a standard RAS command handling.

At block 204, looping for all rows in the DRAM array. This iterates (or parallels) over the M active and N inactive rows to find the matching row, aligning with the comparison logic described above.

At block 206, checking the virtual address against the stored address in the virtual row address storage register for the current row. This compares the received virtual row address with the value stored in the per-row register.

At block 208, determining if the address matches. If no, the process continues to the next row in the loop (block 204). If yes, proceed to check the state.

At block 210, checking the row address state machine value. This retrieves the current state (S0 for active, S1 to SN for inactive rows) from the per-row state machine.

At block 212, determining if the state is S0. If no, continue to the next row (block 204). If yes, this confirms the row is the active one for the virtual address, preventing matches with unassigned inactive rows.

At block 214, activating the row select signal. This opens the access transistors for the selected physical row, exposing the data on the bit lines.

At block 216, transferring the row data to the row data buffer. This senses and latches the data from the selected row into the row buffer latch for output or modification, consistent with destructive read operations in DRAM.

The process then continues to the update phase at block 218, looping for all rows to update states and registers. This second loop applies the dynamic reassignment across all rows, marking the old active row as an inactive row, shifting the inactive states, and assigning the virtual address to the new active row (paragraphs 25, 28, 34).

At block 220, checking the row address state machine value for the current row. This retrieves the current state to determine the update action.

At block 222, determining if the row is active. If yes, proceed to set it to the highest inactive state. If no, proceed to handle inactive row updates.

At block 224, changing the row machine value from S0 to Sn. This marks the previously accessed (read) row as the newest inactive, initiating the cycle.

For the no path from block 222 (inactive rows), at block 226, determining if the value meets the condition for register update. If yes, proceed to update the register. If no, proceed to decrement.

At block 228, changing the row address register to the virtual address. This assigns the virtual row address to the physical row that is transitioning to active status (S0), enabling future accesses to target the new row.

At block 230, changing the row machine value from Sn to Sn−1 (decrement). This shifts the states of the remaining inactive rows in decreasing order, promoting the next inactive to fill the sequence.

At block 232, continuing to the next row in the loop (block 218). This completes the iteration until all rows are updated.

At block 234, ending the Read Row Process. This concludes the read and mapping update, with the row buffer now holding the data and the mapping reassigned.

Following the Read Row Process (and any column operations to modify the row buffer for writes), the method proceeds to the Write Row Process at block 236, starting the write operation. This writes the row buffer back to the newly assigned physical row for the same virtual address.

At block 238, looping for all rows. Similar to block 204, this identifies the current active row post-update.

At block 240, checking the virtual address against the stored address. Identical to block 206, comparing with the updated register values.

At block 242, determining if the address matches. If no, continue to block 247 to proceed to the next row. If yes, proceed to check the state.

At block 244, checking the row address state machine value. Similar to block 210.

At block 246, determining if the state is S0. If no, continue at block 247 to proceed to the next row. If yes, this selects the new active row.

At block 248, activating the row select signal. Similar to block 214, for the new row.

At block 250, writing the row data buffer to the selected row. This reprograms the capacitors in the new physical row with the buffer contents, completing the access cycle without hammering the original row.

At block 252, ending the Write Row Process. This finalizes the operation, ready for subsequent accesses or refreshes.

Those skilled in the art should understand that DRAM is short-hand for Dynamic Random Access Memory and the use thereof includes all types of DRAM including Synchronous DRAM (SDRAM) or Double Data Rate (DDR) DRAM e.g., DDR4 or DDR5, that are currently known or yet to be developed.

Although the DRAM system 100 is depicted in FIG. 14 with distinct components such as the memory controller 102, dynamic mapping row decoder 105, virtual row address storage register 106, row access state machine 108, and DRAM array 104 for illustrative purposes, those skilled in the art will appreciate that these elements may be combined, separated, or reconfigured in various ways without departing from the principles of the present disclosure. For instance, the dynamic mapping row decoder 105 may be integrated into the memory controller 102 or implemented as part of the DRAM array 104; the virtual row address storage register 106 and row access state machine 108 may be consolidated into a single functional unit per row or distributed across multiple circuits; and the overall system may incorporate additional elements such as timing controls, refresh counters, or error correction logic merged with existing blocks. Moreover, these components may be realized using hardware, software, firmware, or combinations thereof, including but not limited to application-specific integrated circuits (ASICs), field-programmable gate arrays (FPGAs), microprocessors, discrete logic gates, or other equivalent structures capable of performing the described functions.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A method for dynamically mapping row addresses to mitigate row hammer effect in dynamic random access memory (DRAM), the method comprising:

providing a DRAM array with M-active rows and N-inactive rows; wherein M and N are integers greater than or equal to one (1), and wherein the M-active rows and the N-inactive rows are disjoint sets of physical rows;

reading data from one of the M-active rows;

writing the data to one of the N-inactive rows, wherein the data is not written to a same row from which the data is read, such that the data is written; and providing a virtual row address storage register for storing a virtual row address for each of the M-active rows and the N-inactive rows;

providing a row access state machine with a state value corresponding to an active state for each of the M-active rows and an inactive state for each of the N-inactive rows;

receiving a read-target row with a virtual row address corresponding to the one of the M-active rows;

reading the data from the read-target row corresponding to the one of the M-active rows;

writing the data from the read-target row corresponding to the one of the M-active rows to the one of the N-inactive rows;

setting the state value of the row access state machine for the read-target row to the inactive state; and setting the state value for the one of the N-inactive rows to which the data is written to an active state.

2. The method of claim 1, wherein the row access state machine is implemented as a counter wherein the active state is represented by ST0 and the inactive states are represented by one of ST1 to STN, where N is the number of the N-inactive rows.

3. The method of claim 2, and further comprising updating the state value of the row access state machine for the read-target row to STN after the data is read from the read-target row.

4. The method of claim 2, and further comprising updating the state value of the row access state machine for the N-inactive rows other that the one of the N-inactive rows to which the data is written.

5. The method of claim 3, wherein updating the state value of the row access state machine for the N-inactive rows other than the one of the N-inactive rows to which the data is written is in a decreasing order from STN−1 to ST1.

6. The method of claim 1, and further comprising initializing, at startup, the virtual row address in the virtual row address storage register for each of the M-active rows to zero (0) and to one of ST1 to STN−1 for each N-inactive rows.

7. The method of claim 1, and further comprising latching data from the read-target row into a row buffer latch after the data is read from the read-target row.

8. The method of claim 1, further comprising comparing in parallel the virtual row address stored in the virtual row address storage register with the state value in the row access state machine to identify the read-target row of the M-active rows.

9. A dynamic random access memory (DRAM) system configured to mitigate row hammer effect through dynamic row address mapping, the system comprising:

a DRAM array comprising a plurality of rows each row having a unique virtual row address, wherein the plurality of rows includes active rows and inactive rows;

a virtual row address storage register configured to store the unique virtual row address for each of the active rows and the inactive rows;

a plurality of row access state machines, each row access state machine of the plurality of row access state machines configured to store a state value for a respective one of the active rows and the inactive rows;

a row buffer latch; and control logic communicatively coupled to the DRAM array, the virtual row address storage register, the row access state machine, and the row buffer latch, the control logic configured to:

receive a target virtual row address for a memory access operation, identify a read-target row by matching the target virtual row address to the virtual row address stored in the virtual row address storage register where the row access state machine of the plurality of row access state machines associated with a matching row indicates an active state, read data from the read-target row into the row buffer latch, write the data from the row buffer latch to one of the inactive rows;

update the state value in the row access state machine of the plurality of row access state machine associated with the read-target row to an inactive state, update the virtual row address in the virtual row address storage register for the one of the inactive rows to which the data was written to the target virtual row address, and update the state value in the row access state machine of the plurality of row access state machines for the one of the inactive rows to which the data was written to the active state.

10. The dynamic random access memory (DRAM) system of claim 9, wherein each row access state machine of the plurality of row access state machines is implemented as a counter wherein the active state is ST0 and the inactive state comprises one of a plurality of inactive states ST1 to STN, where N is the number of inactive rows of the plurality of rows.

11. The dynamic random access memory (DRAM) system of claim 10, wherein the control logic is further configured to, upon initialization, set the virtual row address storage registers associated with the initially active rows to respective initial virtual addresses matching their logical indices and set the virtual row address storage registers associated with the inactive rows to a common value, and set the row access state machines associated of the plurality of row access state machines associated with the initially active rows to ST0 and the row access state machines of the plurality of row access state machines associated with the inactive rows to ST1 through STN.

12. The dynamic random access memory (DRAM) system of claim 11, wherein the control logic is configured to update the state value in the row access state machine of the plurality of row access state machines associated with the read-target row to STN.

13. The dynamic random access memory (DRAM) system of claim 12, wherein the control logic is configured to decrement the state values in the row access state machines of the plurality of row access state machines associated with the inactive rows by decreasing each state value from STN down to ST1, such that the inactive row with state value ST1 transitions to ST0 for the active state.

14. The dynamic random access memory (DRAM) system of claim 9, wherein the control logic comprises comparison logic configured to perform in parallel the matching of the active state with the virtual row address for the read-target row to identify the virtual row address for the read-target row in the active state.

15. The dynamic random access memory (DRAM) system of claim 9, wherein the number of inactive rows of the plurality of rows is determined based on a probabilistic model considering a row hammer threshold and a target bit error rate to maintain a probability of row hammer-induced disturbance errors below a predetermined threshold.

16. A dynamic random access memory (DRAM) system configured to mitigage row hammer effect through dynamic row address mapping, the system comprising:

a DRAM array with a plurality of rows each configured for storing data;

a dynamic mapping row decoder configured for storing a virtual row address for each of the plurality of rows and a state value for each of the plurality of rows wherein the state value is one of an active state and an inactive state; and control logic configured for changing the state value of one of the plurality of rows from which data is read to the inactive state, and changing the virtual row address and the state value to the active state of another one of the plurality of rows to which the data is written, and wherein the control logic comprises a read operation and a write operation, wherein the read operation further comprises comparing a read-target row with a virtual row address stored in the dynamic mapping row decoder that also has the state value in the active state to identify a target virtual row address for the read operation.

17. The dynamic random access memory (DRAM) system of claim 16, wherein the read operation further comprises changing the state value of the read-target row to the inactive state before the write operation.

18. The dynamic random access memory (DRAM) system of claim 17, wherein the write operation comprises writing the data to one of the plurality of rows in the inactive state that is not one of the plurality of rows from which the data was immediately previously read.

* * * * *